(12) United States Patent
Wakamatsu

(10) Patent No.: US 9,136,888 B2
(45) Date of Patent: Sep. 15, 2015

(54) RADIO RECEIVER AND RECEPTION FREQUENCY SETTING METHOD USED THEREIN, AND FREQUENCY SETTING DEVICE AND FREQUENCY SETTING METHOD

(71) Applicant: JVC KENWOOD Corporation, Yokohama-shi, Kanagawa (JP)

(72) Inventor: Shinichiro Wakamatsu, Yokohama (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 14/300,862

(22) Filed: Jun. 10, 2014

(65) Prior Publication Data
US 2015/0004920 A1    Jan. 1, 2015

(30) Foreign Application Priority Data

Jun. 28, 2013  (JP) .................................. 2013-135715
Jan. 29, 2014  (JP) .................................. 2014-013937
Jan. 29, 2014  (JP) .................................. 2014-013939

(51) Int. Cl.
*H04W 24/00* (2009.01)
*H04B 1/06* (2006.01)

(52) U.S. Cl.
CPC ........................................ *H04B 1/06* (2013.01)

(58) Field of Classification Search
CPC .............. H04W 24/00; H04B 17/0042; H04B 17/0057

USPC .............. 455/67.11, 226.1, 67.13, 154.1, 62, 455/703, 115.1, 113, 119
See application file for complete search history.

(56) References Cited

U.S. PATENT DOCUMENTS

| | | | |
|---|---|---|---|
| 5,423,926 A * | 6/1995 | Sashihara et al. .............. 148/508 |
| 8,019,400 B2 * | 9/2011 | Diab et al. ..................... 600/323 |
| 2007/0023655 A1 * | 2/2007 | Nishikata et al. .............. 250/310 |
| 2009/0079955 A1 * | 3/2009 | Tsunesada et al. .......... 356/4.01 |
| 2010/0035569 A1 * | 2/2010 | Aoyama ..................... 455/226.4 |
| 2010/0264746 A1 * | 10/2010 | Kazama et al. ................ 307/104 |
| 2012/0056886 A1 * | 3/2012 | Shiba ............................. 345/419 |

FOREIGN PATENT DOCUMENTS

JP    2000-352569 A    12/2000
JP    2004-347320 A    12/2004

* cited by examiner

*Primary Examiner* — Minh D Dao
(74) *Attorney, Agent, or Firm* — Nath, Goldberg & Meyer; Jerald L. Meyer; Stanley N. Protigal

(57) ABSTRACT

A spectrum analyzer is configured to display, on a display, reception signal intensity of each of multiple frequencies. A smoothing unit is configured to smooth signal intensity data of each of the multiple frequencies to produce smoothed data. A peak frequency detection unit is configured to detect, as a peak frequency, a frequency at a position indicating a maximum value in the smoothed data closest to a contact position that a touch sensor detects. A reception frequency determination unit is configured to determine a reception frequency of a radio wave that a receiver for a voice call receives based on the peak frequency.

9 Claims, 9 Drawing Sheets

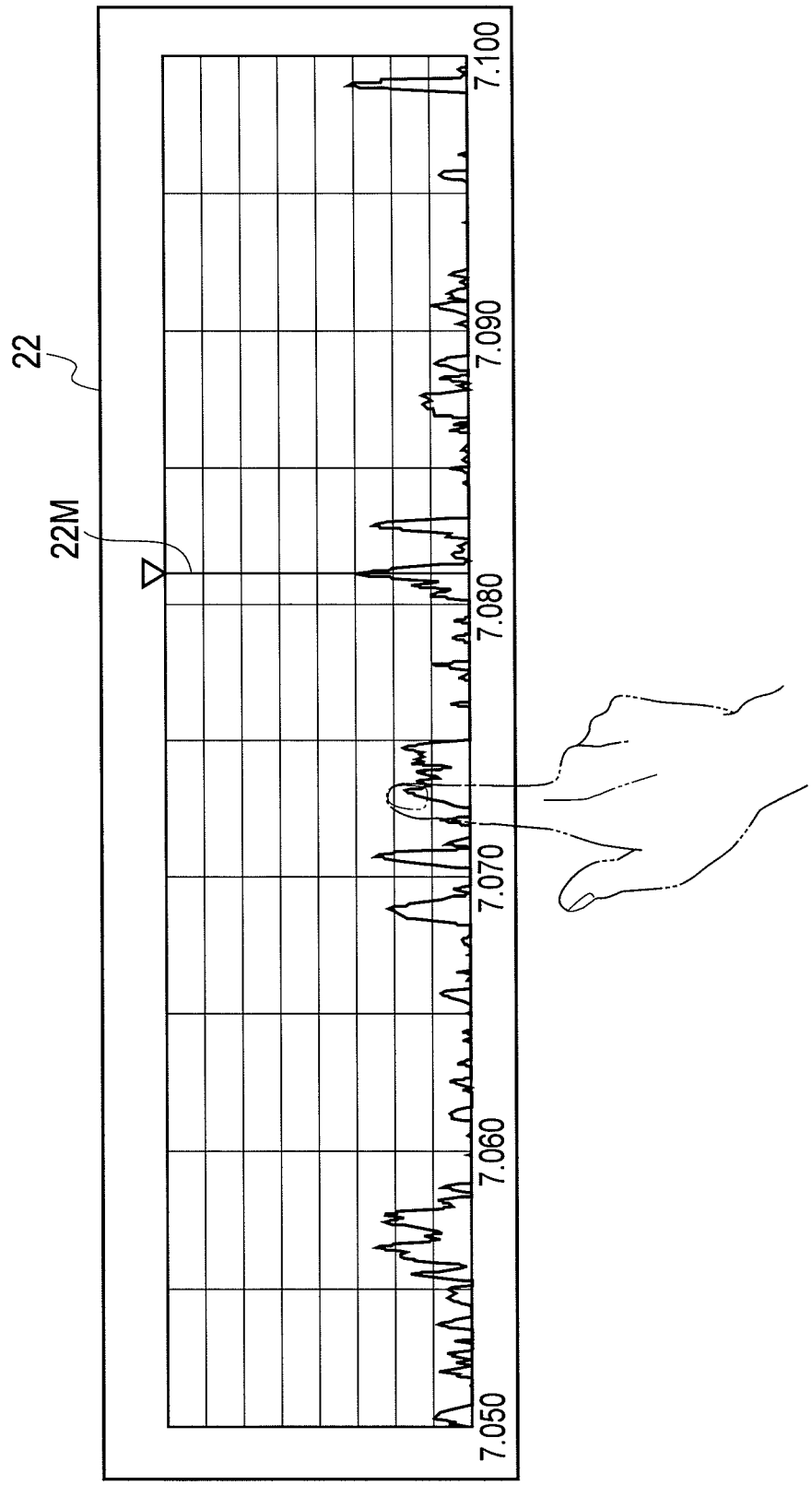

RADIO RECEIVER AND RECEPTION FREQUENCY SETTING METHOD USED THEREIN, AND FREQUENCY SETTING DEVICE AND FREQUENCY SETTING METHOD

CROSS REFERENCE TO RELATED APPLICATION

This application is based upon and claims the benefit of priority under 35 U.S.C. §119 from Japanese Patent Application No. 2013-135715, filed on Jun. 28, 2013, No. 2014-013937, filed on Jan. 29, 2014, and No. 2014-013939, filed on Jan. 29, 2014, the entire contents of all of which are incorporated herein by reference.

BACKGROUND

The present disclosure relates to a radio receiver and a reception frequency setting method used therein, and a frequency setting device and a frequency setting method.

Radio receivers include tuning knobs for adjusting reception frequencies of radio waves. A user turns a tuning knob to tune to a desired reception frequency so as to receive voices or the like transmitted with a radio wave of the tuned reception frequency.

SUMMARY

There is known a radio receiver equipped with a spectrum analyzer which displays reception signal intensity in a predetermined frequency band. A user can visually recognize a transmission signal by a voice call from the other user which is conceived to be receivable according to the reception signal intensity displayed on the spectrum analyzer.

Thus, setting a reception frequency by use of a spectrum analyzer can increase usability compared with the case of setting a reception frequency by turning a tuning knob. In view of this, there is a demand for development of a radio receiver and a reception frequency setting method used therein capable of easily setting reception frequencies of radio waves by use of a spectrum analyzer.

There is also a demand for development of a frequency setting device and a frequency setting method capable of easily setting predetermined frequencies by use of a spectrum analyzer.

A first aspect of the embodiments provides a radio receiver comprising: a spectrum analyzer configured to receive radio waves of multiple frequencies in a predetermined frequency band and measure reception signal intensity of each of the multiple frequencies so as to display the reception signal intensity on a display; a touch sensor placed on the display; a smoothing unit configured to smooth signal intensity data indicating the reception signal intensity of each of the multiple frequencies to produce smoothed data; a peak frequency detection unit configured to detect, as a peak frequency, a frequency at a position indicating a maximum value in the smoothed data closest to a contact position that the touch sensor detects; a receiver for a voice call configured to receive a signal of a frequency used for a voice call; and a reception frequency determination unit configured to determine, based on the peak frequency, a reception frequency of a radio wave that the receiver for a voice call receives.

A second aspect of the embodiments provides a reception frequency setting method comprising: receiving radio waves of multiple frequencies in a predetermined frequency band and measuring reception signal intensity at predetermined time intervals; displaying the reception signal intensity of each of the multiple frequencies on a display of a spectrum analyzer; smoothing signal intensity data indicating the reception signal intensity of each of the multiple frequencies to produce smoothed data; detecting a contact position by a touch sensor placed on the display; detecting, as a peak frequency, a frequency at a position indicating a maximum value in the smoothed data closest to the contact position; and determining, based on the peak frequency, a reception frequency of a radio wave that the receiver for a voice call receives.

A third aspect of the embodiments provides a frequency setting device comprising: a spectrum analyzer configured to measure signal intensity that an input signal of each of multiple frequencies in a predetermined frequency band has so as to display the signal intensity of each of the multiple frequencies on a display; a touch sensor placed on the display; a smoothing unit configured to smooth signal intensity data indicating the signal intensity of each of the multiple frequencies to produce smoothed data; a peak frequency detection unit configured to detect, as a peak frequency, a frequency at a position indicating a maximum value in the smoothed data closest to a contact position that the touch sensor detects; and a frequency determination unit configured to determine a setting frequency based on the peak frequency.

A fourth aspect of the embodiments provides a frequency setting method comprising: measuring, at predetermined time intervals, signal intensity that an input signal of each of multiple frequencies in a predetermined frequency band has; displaying the signal intensity of each of the multiple frequencies on a display of a spectrum analyzer; smoothing signal intensity data indicating the signal intensity of each of the multiple frequencies to produce smoothed data; detecting a contact position by a touch sensor placed on the display; detecting, as a peak frequency, a frequency at a position indicating a maximum value in the smoothed data closest to the contact position; and determining a setting frequency based on the peak frequency.

BRIEF DESCRIPTION OF THE DRAWINGS

FIG. 4 is a view showing an example of reception signal intensity displayed on a spectrum analyzer.

DETAILED DESCRIPTION

Hereinafter, a radio receiver and a reception frequency setting method used therein, and a frequency setting device and a frequency setting method according to the embodiments will be explained with reference to the accompanying drawings.

Figure 1:
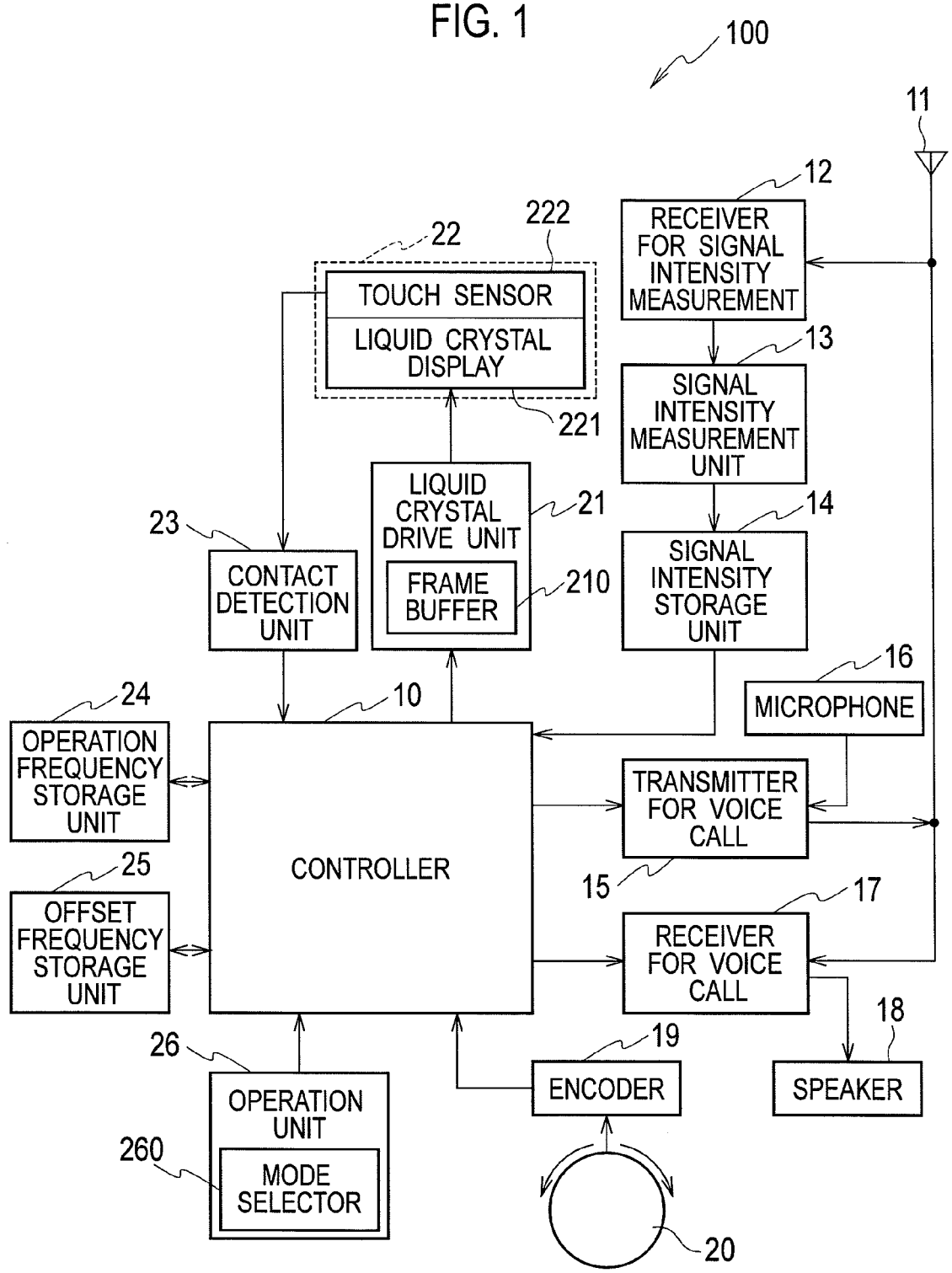
FIG. 1 is a block diagram showing a radio receiver according to at least one embodiment.

FIG. 1 shows a radio transmitter-receiver 100 which is at least one embodiment of a radio receiver. The radio transmitter-receiver 100 includes a frequency setting device according to at least one embodiment.

In FIG. 1, a controller 10 controls the entire radio transmitter-receiver 100. An antenna 11 receives radio waves and supplies the received signals to a receiver for signal intensity measurement 12 and a receiver for a voice call 17. The receiver for signal intensity measurement 12 sequentially changes reception frequencies of radio waves in a predetermined frequency band to sequentially receive signals of the respective reception frequencies. The frequency band is, for example, 50 kHz.

A signal intensity measurement unit 13 measures reception signal intensity of the respective reception frequencies. Namely, the signal intensity measurement unit 13 measures signal intensity that each input signal of the multiple frequencies has.

For example, the signal intensity measurement unit 13 measures, in every 125 ms, the reception signal intensity of each of the reception frequencies at 640 points in the frequency band of 50 kHz. The signal intensity data indicating the reception signal intensity measured by the signal intensity measurement unit 13 is temporarily stored in a signal intensity storage unit 14. The signal intensity data is supplied to the controller 10.

As described below, the signal intensity storage unit 14 stores not only the latest signal intensity data but also the past signal intensity data within a predetermined period of time. For example, the signal intensity storage unit 14 stores the signal intensity data for three seconds including the latest signal intensity data.

A transmitter for a voice call 15 modulates voice signals from a microphone 16 and transmits the modulated signals through the antenna 11. The receiver for a voice call 17 receives the frequency signals used for calls. The receiver for a voice call 17 demodulates a signal of a selected reception frequency among the received signals from the antenna 11. A speaker 18 outputs voices demodulated by the receiver for a voice call 17.

In the case of one-direction communication, the controller 10 controls one of the transmitter for a voice call 15 and the receiver for a voice call 17 to operate, and controls the other one not to operate.

There are several kinds of radio wave modes that the radio transmitter-receiver 100 uses for transmitting and receiving voice signals, and examples thereof include an amplitude modulation (AM) mode, a single sideband (SSB) mode, and a frequency modulation (FM) mode.

The radio wave mode used in the present embodiment is the AM mode, the SSB mode or the FM mode.

The user can change the reception frequency in the receiver for a voice call 17 by turning a tuning knob 20 in the left direction or in the right direction. The amount of rotation of the tuning knob 20 in the left direction or in the right direction is encoded by an encoder 19 so as to be converted into the amount of change of the reception frequency.

The controller 10 changes the reception frequency in the receiver for a voice call 17 according to the amount of change of the reception frequency by the encoder 19. The receiver for a voice call 17 is tuned in to the changed reception frequency.

The radio transmitter-receiver 100 includes a touch panel 22. As described below, the radio transmitter-receiver 100 according to the present embodiment is configured to set the reception frequency in the receiver for a voice call 17 in a manner such that the user touches the touch panel 22, in addition to setting the reception frequency in a manner such that the user turns the tuning knob 20.

The touch panel 22 includes a liquid crystal display 221 and a touch sensor 222 placed on the liquid crystal display 221. Although the display here is a liquid crystal panel, an arbitrary display such as an organic EL panel or a cathode-ray tube may be used. The touch sensor 222 may be an arbitrary touch sensor such as a resistive touch sensor or a capacitance touch sensor.

The controller 10 supplies the latest signal intensity data, among the pieces of the signal intensity data supplied from the signal intensity storage unit 14, to a liquid crystal drive unit 21. The liquid crystal drive unit 21 includes a frame buffer 210. The signal intensity data is temporarily stored in the frame buffer 210. The liquid crystal drive unit 21 drives the liquid crystal display 221 so that the signal intensity data stored in the frame buffer 210 is displayed on the liquid crystal display 221.

The liquid crystal drive unit 21 includes a character generator for displaying characters and figures on the liquid crystal display 221.

The controller 10, the signal intensity measurement unit 13, the signal intensity storage unit 14 and the liquid crystal drive unit 21 consist of a spectrum analyzer which displays the reception signal intensity in a predetermined frequency band.

Figure 2:
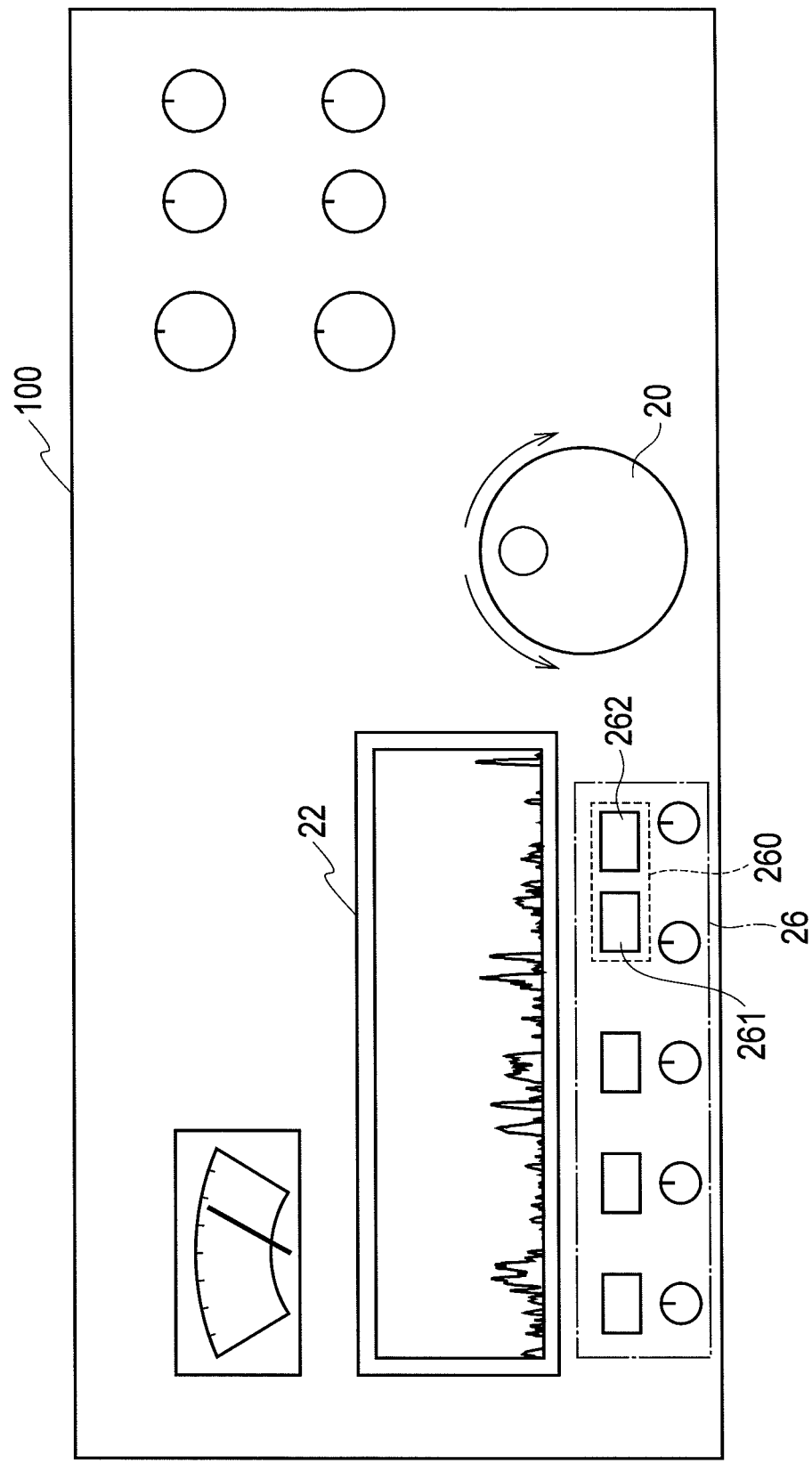
FIG. 2 is an external front view showing a radio receiver according to at least one embodiment.

FIG. 2 is an example of an external front view of the radio transmitter-receiver 100. The reception signal intensity in a predetermined frequency band is displayed on the touch panel 22 while being updated every 125 ms.

Back to FIG. 1, once the user touches the touch panel 22, a contact detection unit 23 determines which part the user touches on the touch sensor 222. According to the present embodiment, the contact detection unit 23 is only required to detect the touched position in the horizontal direction on the touch panel 22 shown in FIG. 2. The positional information detected by the contact detection unit 23 is supplied to the controller 10.

An operation frequency storage unit 24 stores reception frequencies set by the tuning knob 20 or the touch panel 22 used for receiving radio waves in the receiver for a voice call 17. The operation frequency storage unit 24 also stores transmission frequencies when the transmission frequencies used for transmitting radio waves in the transmitter for a voice call 15 are different from the reception frequencies. An offset frequency storage unit 25 stores offset frequencies described below.

An operation unit 26 is connected to the controller 10. The operation unit 26 includes a mode selector 260 to select one of the radio wave modes.

As shown in FIG. 2, the operation unit 26 includes, for example, a plurality of buttons and knobs located below the touch panel 22. The mode selector 260 includes a selection button 261 for selecting the AM mode, the SSB mode or the FM mode, and a selection button 262 for selecting a lower sideband (LSB) mode or an upper sideband (USB) mode when the SSB mode is selected.

In the SSB mode, the LSB mode is used when the frequency is 9.5 MHz or lower, and the USB mode is used when the frequency exceeds 9.5 MHz. Instead of selecting the LSB mode or the USB mode with the selection button 262, the LSB mode or the USB mode may automatically be selected according to the frequency.

Figure 3A:
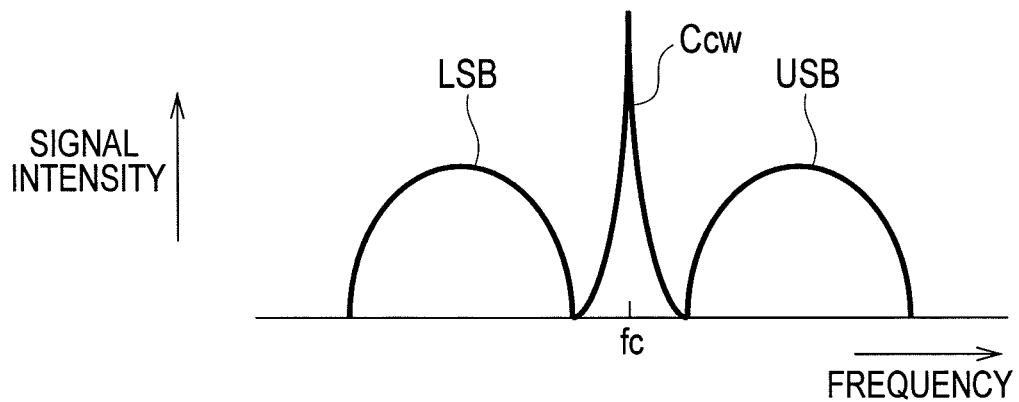
FIG. 3A is a view for explaining a wave frequency band used in AM mode.

The respective radio wave modes are explained below with reference to FIG. 3A to FIG. 3C. FIG. 3A schematically shows a frequency band used in the AM mode. The AM mode uses all of the carrier wave frequency components Ccw located at a carrier wave frequency fc, a lower sideband LSB located on the lower side of the carrier wave frequency components Ccw, and an upper sideband USB located on the upper side of the carrier wave frequency components Ccw. The carrier wave frequency fc corresponds to the reception frequency.

Figure 3B:
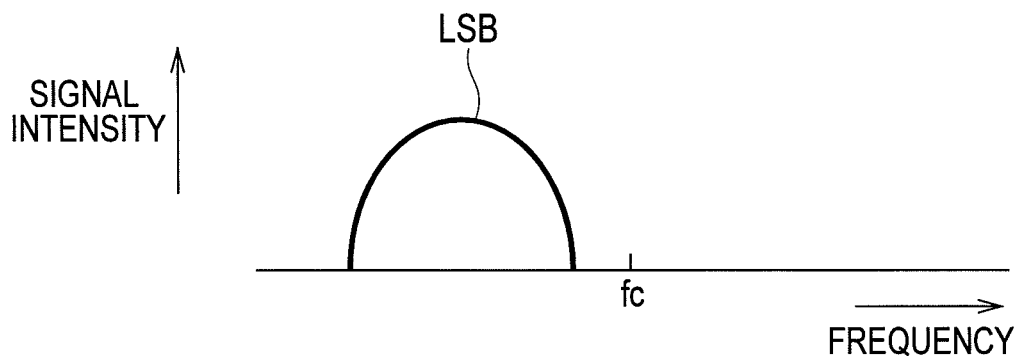
FIG. 3B is a view for explaining a wave frequency band used in LSB mode of SSB mode.

FIG. 3B schematically shows a frequency band used in the LSB mode. The lower sideband LSB is only used in the LSB mode. Since only the lower sideband LSB is extracted by use of a filter to remove other band components, there is no carrier wave frequency component Ccw in the LSB mode.

Figure 3C:
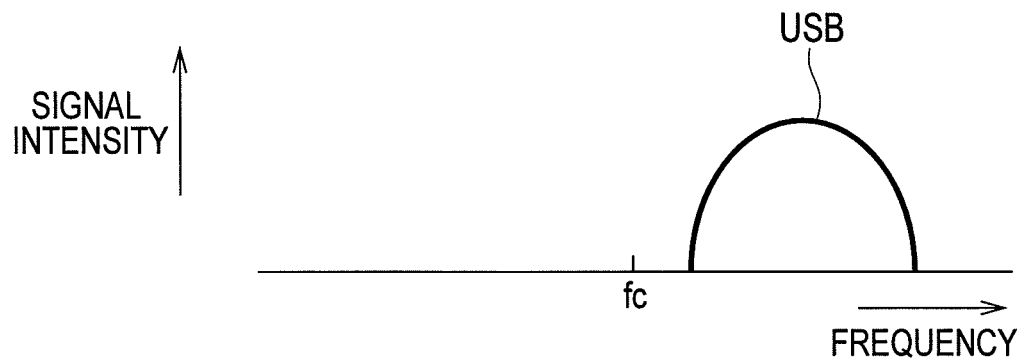
FIG. 3C is a view for explaining a wave frequency band used in USB mode of SSB mode.

FIG. 3C schematically shows a frequency band used in the USB mode in the SSB mode. The upper sideband USB is only used in the USB mode. Since only the upper sideband USB is extracted by use of a filter to remove other band components, there is no carrier wave frequency component Ccw in the USB mode.

In FIG. 1, when the mode selector 260 selects the AM mode, the controller 10 controls the offset frequency storage unit 25 to store "0" as the offset frequency. When the mode selector 260 selects the SSB mode, the controller 10 controls the offset frequency storage unit 25 to store, for example, 500 Hz as the offset frequency.

The offset frequency in the case of selecting the SSB mode is not limited to 500 Hz. The operation unit 26 may choose the offset frequency among several frequencies in the case of the SSB mode.

The following is an explanation of a reception frequency setting method for setting the reception frequency by use of the spectrum analyzer in the radio transmitter-receiver 100 having the constitution described above.

When the user touches, with a finger, the position corresponding to the frequency to be tuned in the frequency band displayed on the touch panel 22, the controller 10 sets the reception frequency in the receiver for a voice call 17 to the frequency corresponding to the position on which the user touches with the finger in a manner described below.

FIG. 4 shows reception signal intensity in the band of 50 kHz from 7.0500000 MHz to 7.100000 MHz as an example of the frequency band displayed on the spectrum analyzer (the touch panel 22). A marker 22M indicating the position of the reception frequency currently selected is displayed on the touch panel 22. In FIG. 4, grid lines, which are omitted in FIG. 2, are displayed on the touch panel 22.

First, the operation in the case where the SSB mode is selected is explained.

The reception signal intensity with regard to the respective frequencies at 640 points displayed on the touch panel 22 includes a plurality of maximum values. The positions indicating the maximum values are the frequencies where the lower sideband LSB or the upper sideband USB is present. The frequencies where the maximum values are positioned are frequencies conceived to be receivable in the state where voice signals are transmitted by the other user.

As shown in FIG. 4, for example, the user selects one of the maximum values and touches the position of the frequency where the selected maximum value is located on the touch panel 22. Here, the finger pad has a certain area, and the resolution of the touch sensor 222 is not precise to accurately recognize each of the 640 points in the horizontal direction on the touch panel 22. Thus, it is difficult for the user to directly indicate a desired frequency on the touch panel 22.

As described above, the reception signal intensity displayed on the touch panel 22 is indicated by instantaneous values every 125 ms. The frequencies of the maximum values displayed on the touch panel 22 vary depending on how the other user speaks. Therefore, the signal intensity storage unit 14 preferably stores the past signal intensity data within a predetermined period of time.

In the present embodiment, the signal intensity data for last three seconds including the latest signal intensity data is stored. The length of time may be the last one second. The length of time is not particularly limited and may be determined as appropriate. The controller 10 preferably determines the reception frequency by use of the past signal intensity data within a predetermined period of time.

Figure 5:
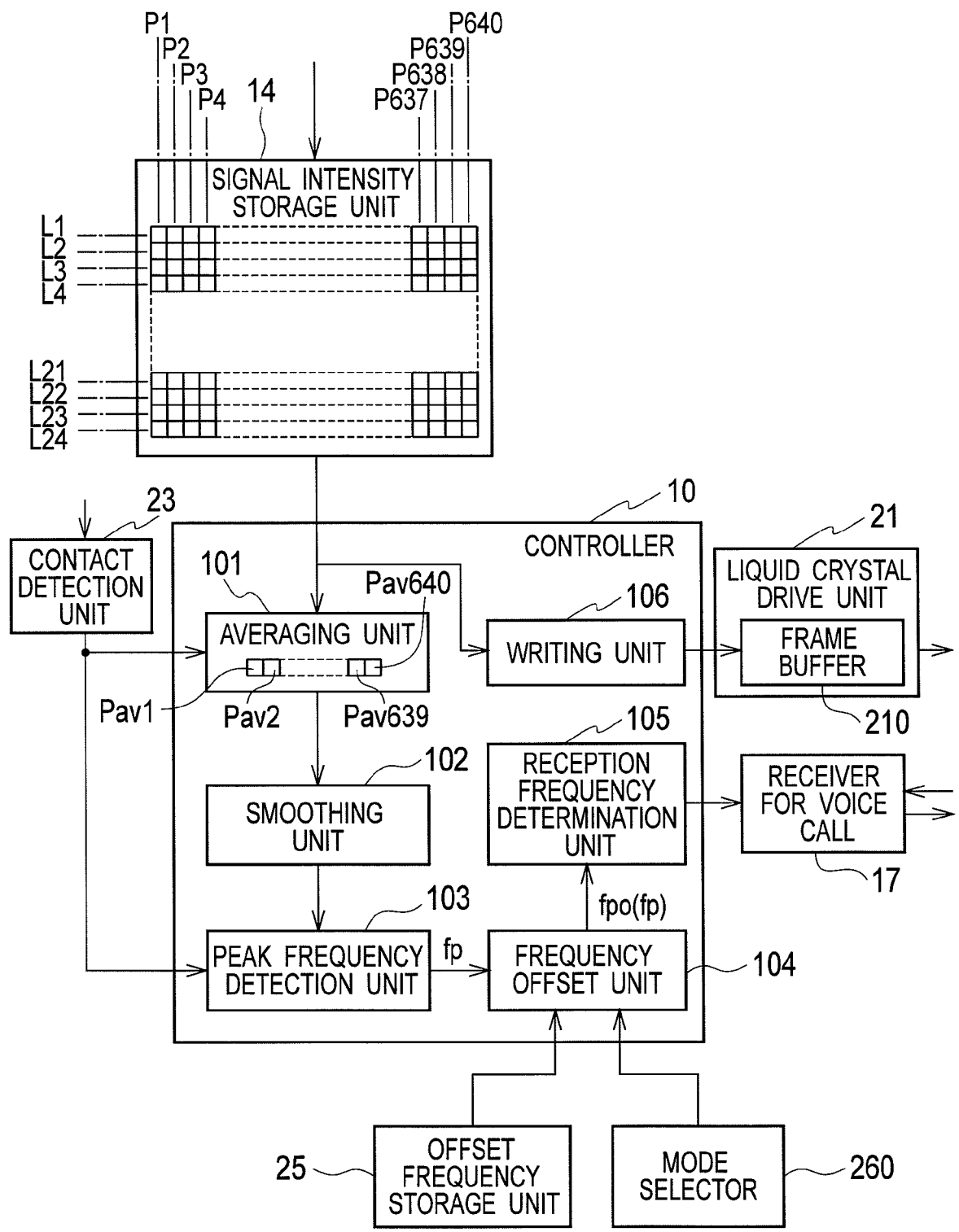
FIG. 5 is a block diagram showing a specific constitution of part of the embodiment shown in FIG. 1.

As shown in FIG. 5, addresses for storing pieces of signal intensity data for 24 lines from L1 to L24 each having 640 points from P1 to P640, are arranged in the signal intensity storage unit 14.

The pieces of the signal intensity data indicated by the instantaneous values every 125 ms at the respective frequencies at 640 points displayed on the touch panel 22, are sequentially written in line L1 to line L24. When the signal intensity data is written in line L24, the latest signal intensity data is then written in the oldest line L1. The same process is repeated to write the latest signal intensity data over the oldest signal intensity data so as to update the signal intensity data.

The signal intensity storage unit 14 may be composed of a random access memory (RAM). Alternatively, the signal intensity storage unit 14 may be composed of a shift register with 24 lines and 640 rows.

The controller 10 includes, as functional constituents, an averaging unit 101, a smoothing unit 102, a peak frequency detection unit 103, a frequency offset unit 104, a reception frequency determination unit 105, and a writing unit 106.

The latest signal intensity data stored in the signal intensity storage unit 14 is input into the writing unit 106. The writing unit 106 writes the latest signal intensity data into a frame buffer 210. Accordingly, the latest reception signal intensity updated every 125 ms is displayed on the touch panel 22.

The signal intensity data for last three seconds stored in the signal intensity storage unit 14 is input into the averaging unit 101.

Once the information about the contact position on the touch panel 22 touched by the user is input into the averaging unit 101 from the contact detection unit 23, the averaging unit 101 averages the pieces of the signal intensity data at 640 points from P1 to P640. Alternatively, the averaging unit 101 may simply be notified that the user touched the touch panel 22, instead of being supplied with the positional information. These average data at 640 points from P1 to P640 are sequentially indicated by Pav1 to Pav640.

These average data Pav1 to Pav640 produced by the averaging unit 101 are input into the smoothing unit 102.

The smoothing unit 102 smoothes these input average data Pav1 to Pav640 to reduce the variation of the reception signal intensity.

Figure 6A:
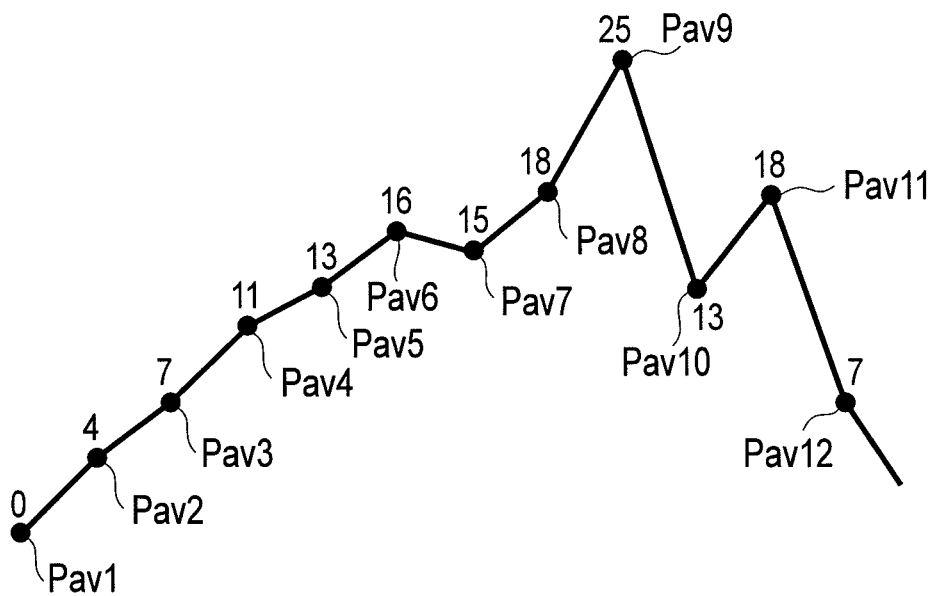
FIG. 6 A and FIG. 6B are waveforms for explaining an example of smoothing processing by a smoothing unit 102 shown in FIG. 5.

An example of the smoothing processing by the smoothing unit 102 is explained below with reference to FIG. 6A and FIG. 6B. FIG. 6A is an example of the average data output from the averaging unit 101. The values of the average data Pav1, Pav2, Pav3, Pav4, . . . are 0, 4, 7, 11, . . . respectively.

For example, in the case of smoothing five points, the smoothing unit 102 newly determines, as a value at a central point to be smoothed (smoothed data), the average value of the five points including the respective two points on both sides of the central point.

In FIG. 6A, since the average data Pav1 on the leftmost side and the average data Pav2 on the right side of the average data Pav1 do not have two points on the left side thereof, the average value of the five points cannot be obtained with regard to these average data. Therefore, the smoothing unit 102 can only obtain the smoothed data from the third average data Pav3 from the left. The smoothed data corresponding to the average data Pav3, Pav4, Pav5, . . . is indicated by Psm3, Psm4, Psm5, . . . respectively.

Figure 6B:
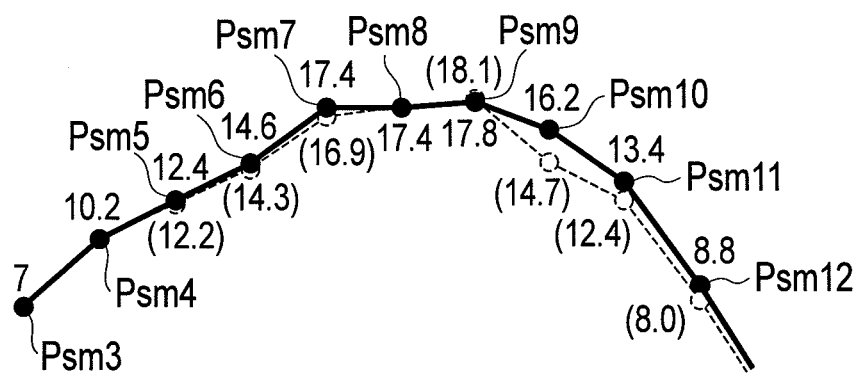

As shown in FIG. 6B, the smoothed data Psm3 for the average data Pav3 is 7, which is obtained by adding 0, 4, 7, 11 and 13 and then dividing the obtained value by 5. The smoothed data Psm4 for the average data Pav4 is 10.2, which is obtained by adding 4, 7, 11, 13 and 16 and then dividing the obtained value by 5.

Each average data Pav3, Pav4, Pav5, . . . shown in FIG. 6A is smoothed in the same manner as described above, and the smoothed data Psm3, Psm4, Psm5, . . . shown in FIG. 6B is then obtained respectively, so as to result in the waveform indicated by the solid line in FIG. 6B.

When an arbitrary point in the average data in FIG. 6A is defined as "n", the smoothed data Psm(n) at the arbitrary point n is calculated by the following formula (1).

$$Psm(n)=\{Pav(n-2)+Pav(n-1)+Pav(n)+Pav(n+1)+Pav(n+2)\}/5 \quad (1)$$

According to the formula (1), five pieces of the average data at five points are used to obtain the smoothed data Psm(n). Alternatively, the smoothed data Psm(n) may be obtained in such a manner as to substitute, for the values of the average data at the two points on the left side of the central point to be smoothed among the five points, the already-obtained values of the smoothed data at the left two points.

With regard to the fifth average data Pav5 from the left in FIG. 6A, the values of the smoothed data at the left two points thereof have been obtained, wherein the smoothed data Psm3 for the average data Pav3 is 7, and the smoothed data Psm4 for the average data Pav4 is 10.2. Thus, instead of the smoothed data Psm5 resulting in 12.4 obtained by adding 7, 11, 13, 16 and 15 and then dividing the obtained value by 5, the smoothed data Psm5 may be 12.2 obtained by adding 7, 10.2, 13, 16 and 15 and then dividing the obtained value by 5.

The smoothed data Psm(n) of the central point to be smoothed is obtained by using the values of the smoothed data at the two points on the left side of the central point in the same manner as described above, so as to result in the waveform indicated by the dotted line in FIG. 6B. This alternative way yields much smoother smoothed data.

Instead of the formula (1), the smoothed data Psm(n) may be obtained according to the following formula (2) using a weighted average of five points.

$$Psm(n)=\{Pav(n-2)+Pav(n-1)\times 2+Pav(n)\times 3+Pav(n+1)\times 2+Pav(n+2)\}/9 \quad (2)$$

According to the formula (2), since the central point is weighted, the respective maximum values are kept compared with the case using the formula (1). The smoothed data obtained by the smoothing processing using the formula (2) is not as smooth as that obtained by the smoothing processing using the formula (1). It is preferable to use the formula (1) rather than to use the formula (2) to obtain smoother smoothed data.

The smoothing processing by the smoothing unit 102 is not limited to the processing using five points as described above. The smoothing processing using three points or seven points may also be used. As the number of the points used increases, smoother smoothed data can be obtained. The number of the points used for smoothing may be determined as appropriate.

As described above, the smoothing processing using several points in the frequency direction is preferable. Alternatively, the smoothing processing in the time direction may be employed in such a manner as to sufficiently ensure the time for averaging per point. The smoothing processing in the time direction may be included in the present embodiment.

Back to FIG. 5, the smoothed data produced by the smoothing unit 102 is input into the peak frequency detection unit 103. The information of the contact position on the touch panel 22 touched by the user is input from the contact detection unit 23 into the peak frequency detection unit 103.

Figure 7:
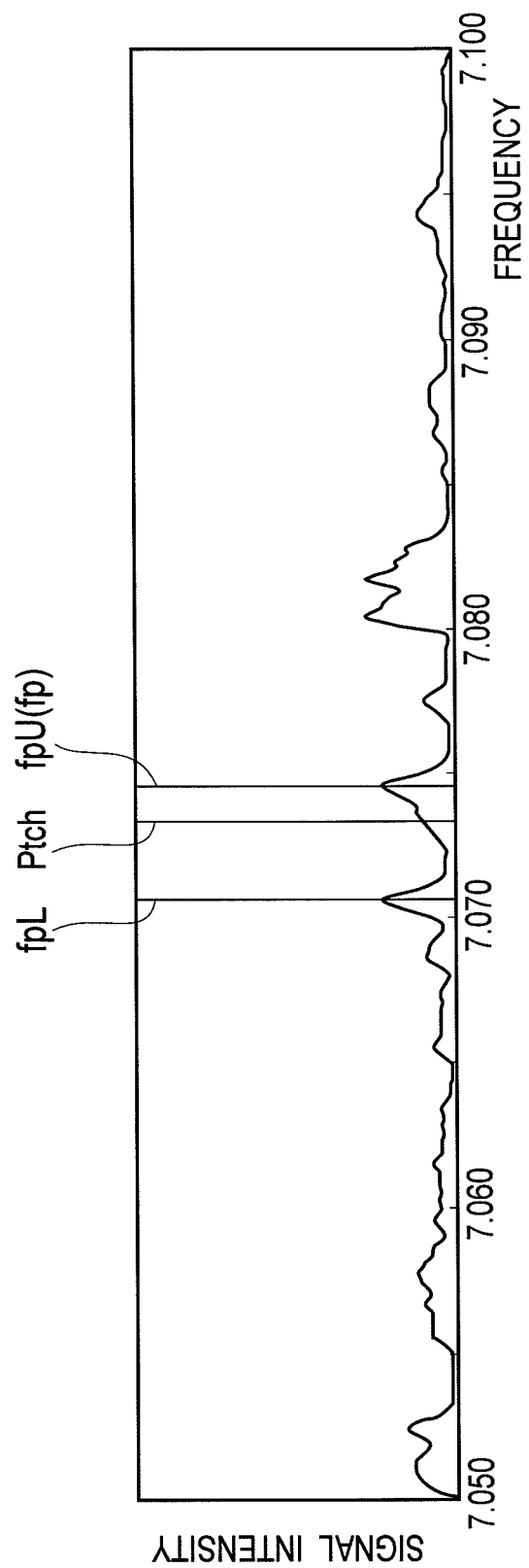
FIG. 7 is a view showing a spectrum of smoothed data produced by the smoothing unit 102 shown in FIG. 5.

FIG. 7 shows a spectrum of the smoothed data produced by the smoothing unit 102 in the band from 7.0500000 MHz to 7.100000 MHz. The vertical axis in FIG. 7 represents the signal intensity of the smoothed data. The spectrum of FIG. 7 is not displayed on the touch panel 22.

For example, in FIG. 7, the contact detection unit 23 determines that the contact position on the touch panel 22 touched by the user is Ptch so that the positional information indicating the contact position Ptch is input into the peak frequency detection unit 103.

As shown in FIG. 7, the peak frequency detection unit 103 detects frequencies showing the respective maximum values in the higher-frequency direction and in the lower-frequency direction closest to the frequency indicated by the contact position Ptch. The respective frequencies showing the maximum values are referred to as peak frequencies.

The peak frequency located in the higher-frequency direction with respect to the frequency indicated by the contact position Ptch, is defined as fpU. The peak frequency located in the lower-frequency direction with respect to the frequency indicated by the contact position Ptch, is defined as fpL. The peak frequency detection unit 103 determines one of the peak frequency fpU or the peak frequency fpL as a peak frequency fp which is closer to the frequency indicated by the contact position Ptch.

In FIG. 7, the peak frequency detection unit 103 determines the peak frequency fpU as the peak frequency fp.

The peak frequency detection unit 103 detects the peak frequency fpU and the peak frequency fpL and chooses one of them which is closer to the frequency indicated by the contact position Ptch so as to determine one as the closest peak frequency fp.

The peak frequency detection unit 103 can easily determine the peak frequency fp based on the smoothed data produced by the smoothing unit 102. The peak frequency fp is input into the frequency offset unit 104.

Figure 8A:
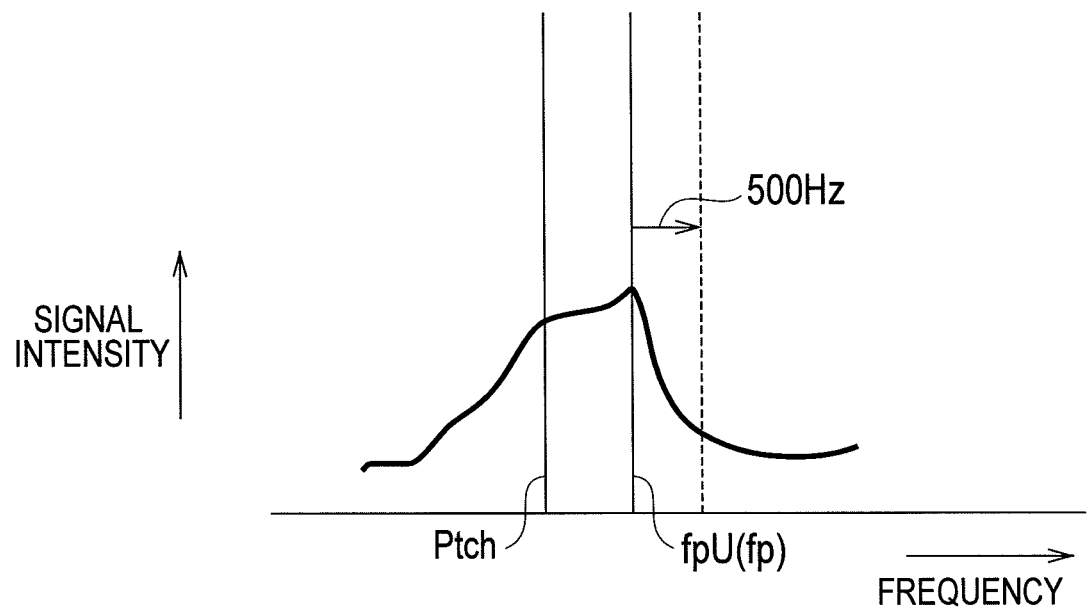
FIG. 8A and FIG. 8B are waveforms for explaining offsetting of a peak frequency by a frequency offsetting unit 104 shown in FIG. 5.

As shown in FIG. 8A, when the mode selector 260 selects the LSB mode, the frequency offset unit 104 adds, to the peak frequency fp, the offset frequency stored in the offset frequency storage unit 25. In particular, the frequency offset unit 104 adds 500 Hz to the peak frequency fp.

In order to receive the lower sideband LSB shown in FIG. 3B by the receiver for a voice call 17, the reception frequency is required to be set to the carrier wave frequency fc. As shown in FIG. 8A, a frequency around the carrier wave frequency fc can be obtained by shifting the peak frequency fp by 500 Hz in the higher-frequency direction.

Figure 8B:
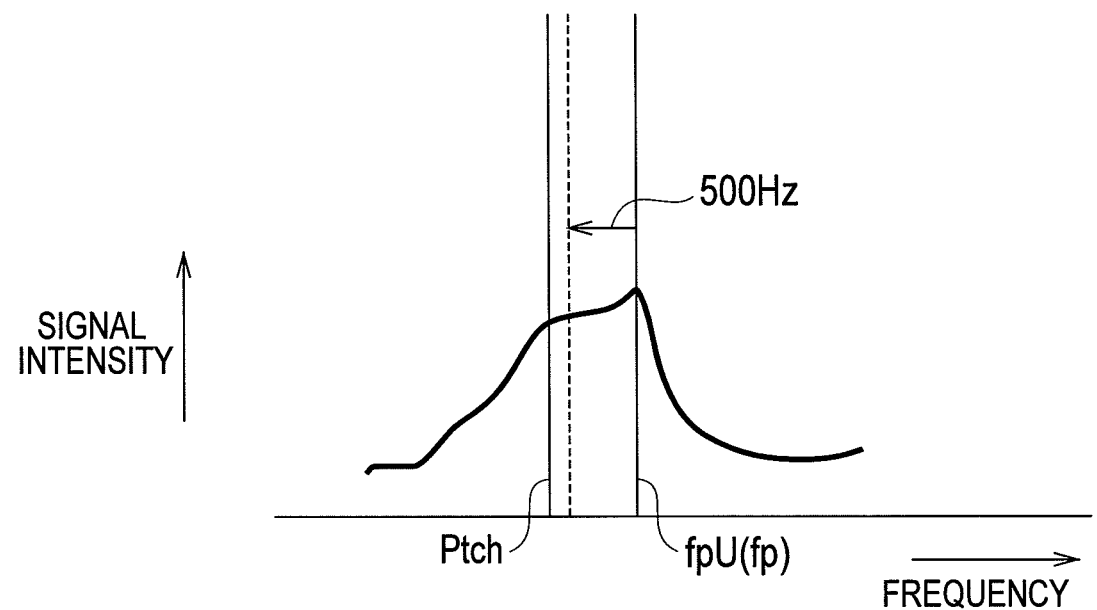

As shown in FIG. 8B, when the mode selector 260 selects the USB mode, the frequency offset unit 104 subtracts, from the peak frequency fp, the offset frequency stored in the offset frequency storage unit 25. In particular, the frequency offset unit 104 subtracts 500 Hz from the peak frequency fp.

In order to receive the upper sideband USB shown in FIG. 3C by the receiver for a voice call 17, the reception frequency is required to be set to the carrier wave frequency fc. As shown in FIG. 8B, a frequency around the carrier wave frequency fc can be obtained by shifting the peak frequency fp by 500 Hz in the lower-frequency direction.

As described above, since there is no carrier wave frequency component Ccw in the SSB mode, the carrier wave frequency fc cannot be directly obtained in the SSB mode. The peak frequency fp of either the lower sideband LSB or the upper sideband USB is obtained so that the carrier wave frequency fc is indirectly obtained based on the obtained peak frequency fp.

Here, the frequency obtained by shifting the peak frequency fp by 500 Hz does not necessarily conform to the carrier wave frequency fc. In addition, there is a case where a higher sound quality may be obtained by shifting the frequency by an offset frequency other than 500 Hz. In view of this, the operation unit 26 is preferably capable of selecting the offset frequency among several frequencies when the SSB mode is selected.

The frequency offset unit 104 supplies, to the reception frequency determination unit 105, a peak offset frequency fpo obtained by offsetting the peak frequency fp by the offset frequency.

The frequency corresponding to the carrier wave frequency fc is generally preliminarily determined. For example, the carrier wave frequency fc is determined in every 500 Hz. Therefore, the reception frequency determination unit 105 preferably rounds a frequency "f" lower than 1 kHz for the peak offset frequency fpo according to the following rules.

$0 \leq f < 250$: 0 Hz
$250 \leq f < 750$: 500 Hz
$750 \leq f < 1000$: 1000 Hz

By rounding the frequency f lower than 1 kHz for the peak offset frequency fpo according to the rules described above, the frequency corresponding to the carrier wave frequency fc closest to the peak offset frequency fpo, can be obtained.

The reception frequency determination unit 105 determines, as a final reception frequency, the frequency obtained by rounding the frequency f lower than 1 kHz for the peak offset frequency fpo to any of the values 0, 500 and 1000. The reception frequency determination unit 105 supplies the determined reception frequency to the receiver for a voice call 17.

Next, the operation in the case where the AM mode or the FM mode is selected is explained.

As shown in FIG. 3A, in the AM mode, the carrier wave frequency components Ccw are present at the carrier wave frequency fc. The signal intensity of the carrier wave frequency components Ccw is higher than the signal intensity of each of the lower sideband LSB and the upper sideband USB.

Therefore, the user can touch the position adjacent to the carrier wave frequency components Ccw on the touch panel 22. Once the user touches the position adjacent to the carrier wave frequency components Ccw, the peak frequency detection unit 103 detects the peak frequency fp of the carrier wave frequency components Ccw. The peak frequency fp of the carrier wave frequency components Ccw is substantially equal to the carrier wave frequency fc.

As in the case of the AM mode, there are only the carrier wave frequency components Ccw in the FM mode when not being modulated. The frequency of the carrier wave frequency components Ccw is symmetrically shifted from the carrier wave frequency fc when being modulated. The frequency shift is determined depending on the level of modulation (the volume of modulation in the case of voice modulation). Therefore, the peak of the smoothed data in the spectrum of the FM signal modulated by voice, is substantially equal to the carrier wave frequency fc.

When the mode selector 260 selects the AM mode or the FM mode, the offset frequency stored in the offset frequency storage unit 25 is 0. The frequency offset unit 104 does not offset the peak frequency fp but supplies the peak frequency fp directly to the reception frequency determination unit 105.

The reception frequency determination unit 105 also determines, as a final reception frequency, the frequency obtained by rounding the frequency f lower than 1 kHz for the peak frequency fp to any of the values 0, 500 and 1000. The reception frequency determination unit 105 supplies the determined reception frequency to the receiver for a voice call 17.

As described above, once the reception frequency is determined, the liquid crystal drive unit 21 shifts the marker 22M shown in FIG. 4 on the touch panel 22 to the position corresponding to the newly determined reception frequency.

Here, there is a mode, as a display mode in the spectrum analyzer, in which the marker 22M indicating the reception frequency is constantly positioned in the center of the touch panel 22 in the horizontal direction. In this mode, instead of the shift of the marker 22M, the frequency band displayed on the touch panel 22 may be shifted so that the reception frequency newly determined is located in the center in the horizontal direction.

Hereinafter, the operation of the radio transmitter-receiver 100 and the reception frequency setting method are explained in more detail with reference to the flowchart shown in FIG. 9. The reception frequency setting method according to FIG. 9 is also a frequency setting method of one embodiment.

Figure 9:
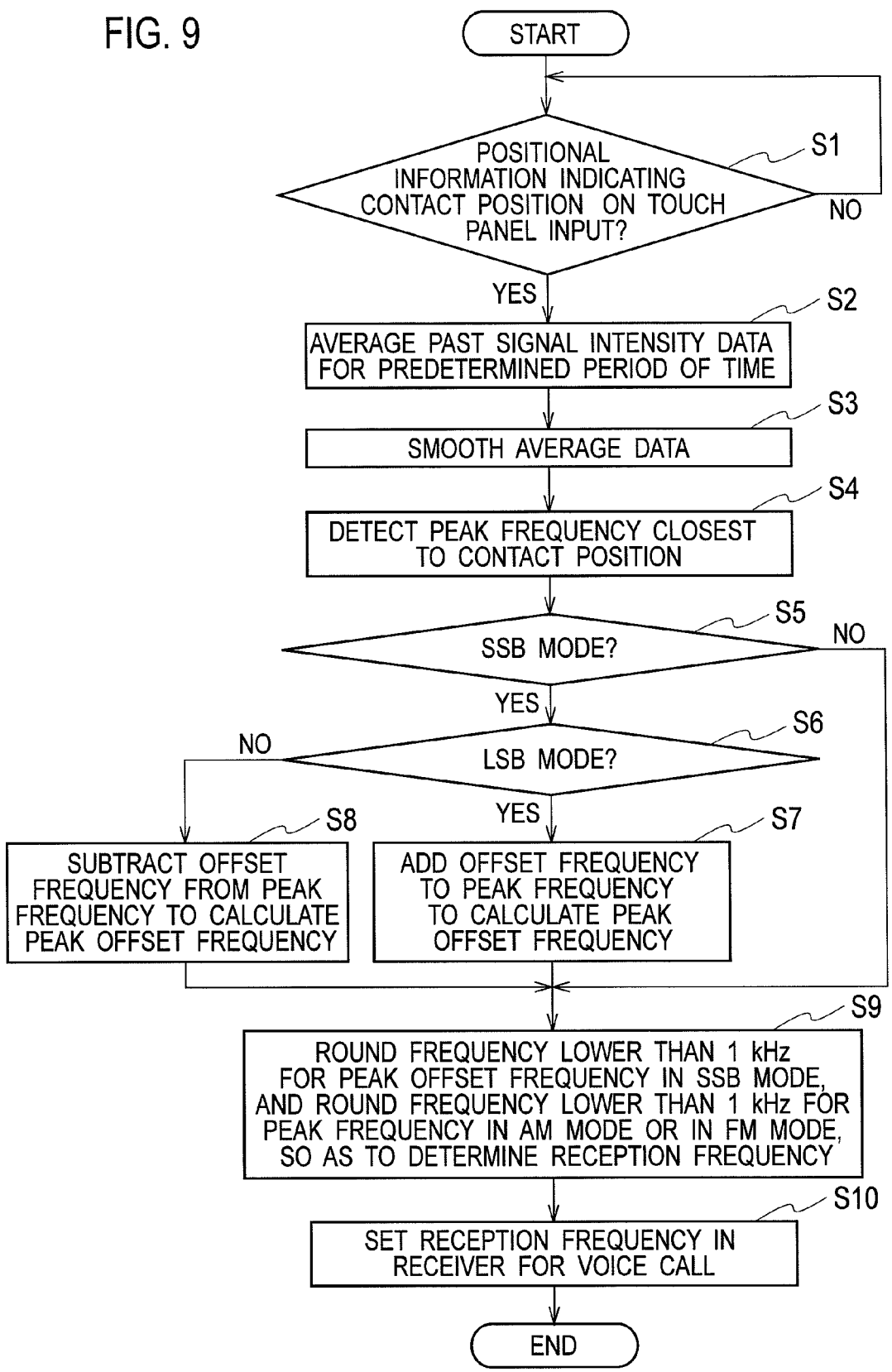
FIG. 9 is a flowchart showing an operation of a radio receiver and a reception frequency setting method according to at least one embodiment.

As shown in FIG. 9, the controller 10 determines in step S1 whether the positional information indicating the contact position on the touch panel 22 is input. When the positional information is input (YES), the controller 10 proceeds to step S2. When the positional information is not input (NO), the controller 10 repeats the process of step S1.

The controller 10 averages the past signal intensity data for a predetermined period of time in step S2. It is preferable to follow the process of step S2 but is not required. The controller 10 smoothes the average data in step S3. When the process of step S2 is omitted, the controller 10 smoothes the signal intensity data in step S3.

The controller 10 detects the peak frequency fp closest to the contact position in step S4. The controller 10 determines in step S5 whether the radio wave mode in the receiver for a voice call 17 is set to the SSB mode.

When the mode is set to the SSB mode (YES), the controller 10 proceeds to step S6. When the mode is not set to the SSB mode (NO), the controller 10 proceeds to step S9.

The controller 10 determines whether the mode is set to the LSB mode in step S6. When the mode is set to the LSB mode (YES), the controller 10 adds the offset frequency to the peak frequency fp to calculate the peak offset frequency fpo in step S7.

When the mode is not set to the LSB mode (NO), the controller 10 subtracts the offset frequency from the peak frequency fp to calculate the peak offset frequency fpo in step S8.

In step S9, the controller 10 rounds the frequency lower than 1 kHz for the peak offset frequency fpo in the SSB mode, and rounds the frequency lower than 1 kHz for the peak frequency fp in the AM mode or in the FM mode, so as to determine the reception frequency. The controller 10 is only required to round to the frequency with predetermined digits closest to the peak frequency. The controller 10 sets the reception frequency in the receiver for a voice call 17 in step S10 to complete the operation.

In the example shown in FIG. 9, once the positional information indicating the contact point on the touch panel 22 is input, the averaging unit 101 averages the signal intensity data, and the smoothing unit 102 smoothes the average data Pav1 to Pav640. Therefore, the averaging unit 101 and the smoothing unit 102 are only required to be activated only when the user touches the touch panel 22.

Of course, while the averaging unit 101 and the smoothing unit 102 are activated regardless of whether the user touches the touch panel 22, the peak frequency detection unit 103 may detect the peak frequency once the user touches the touch panel 22.

The present invention is not limited to the embodiments described above, and various modifications and improvements can be made without departing from the scope of the present invention.

The present invention is not limited only to the technique of setting the reception frequency of the receiver for a voice call 17. The present invention is applicable to the technique of setting, as a center frequency of the spectrum analyzer, the peak frequency obtained by the peak frequency detection method described above.

The present invention is also applicable to the technique of setting, as a marker frequency of the spectrum analyzer, the peak frequency obtained by the peak frequency detection method described above. Further, the present invention is applicable to the technique of setting the peak frequency as a transmission frequency of the transmitter for a voice call 15.

The present invention can be the frequency setting device and the frequency setting method for setting various predetermined frequencies by use of the spectrum analyzer.

What is claimed is:

1. A radio receiver comprising:
a spectrum analyzer configured to receive radio waves of multiple frequencies in a predetermined frequency band and measure reception signal intensity of each of the multiple frequencies so as to display the reception signal intensity on a display;
a touch sensor placed on the display;
a smoothing unit configured to smooth signal intensity data indicating the reception signal intensity of each of the multiple frequencies to produce smoothed data;
a peak frequency detection unit configured to detect, as a peak frequency, a frequency at a position indicating a maximum value in the smoothed data closest to a contact position that the touch sensor detects;
a receiver for a voice call configured to receive a signal of a frequency used for a voice call; and
a reception frequency determination unit configured to determine, based on the peak frequency, a reception frequency of a radio wave that the receiver for a voice call receives.

2. The radio receiver according to claim 1, further comprising a frequency offset unit configured to offset the peak frequency by a predetermined offset frequency to produce a peak offset frequency,
wherein the frequency offset unit produces the peak offset frequency when a radio wave mode in the receiver for a voice call is set to an SSB mode, and
the reception frequency determination unit determines the reception frequency based on the peak offset frequency.

3. The radio receiver according to claim 2, wherein the reception frequency determination unit rounds the peak offset frequency to a frequency corresponding to a carrier wave frequency of a radio wave closest to the peak offset frequency so as to determine the rounded frequency as the reception frequency.

4. The radio receiver according to claim 1, further comprising:
a signal intensity storage unit configured to store the signal intensity data indicating the reception signal intensity for a predetermined period of time for each of the multiple frequencies; and
an averaging unit configured to average the signal intensity data for a predetermined period of time for each of the multiple frequencies to produce average data,
wherein the smoothing unit produces the smoothed data by smoothing the average data.

5. A reception frequency setting method comprising:
receiving radio waves of multiple frequencies in a predetermined frequency band and measuring reception signal intensity at predetermined time intervals;
displaying the reception signal intensity of each of the multiple frequencies on a display of a spectrum analyzer;
smoothing signal intensity data indicating the reception signal intensity of each of the multiple frequencies to produce smoothed data;
detecting a contact position by a touch sensor placed on the display;
detecting, as a peak frequency, a frequency at a position indicating a maximum value in the smoothed data closest to the contact position; and
determining, based on the peak frequency, a reception frequency of a radio wave that the receiver for a voice call receives.

6. A frequency setting device comprising:
a spectrum analyzer configured to measure signal intensity that an input signal of each of multiple frequencies in a predetermined frequency band has so as to display the signal intensity of each of the multiple frequencies on a display;
a touch sensor placed on the display;
a smoothing unit configured to smooth signal intensity data indicating the signal intensity of each of the multiple frequencies to produce smoothed data;
a peak frequency detection unit configured to detect, as a peak frequency, a frequency at a position indicating a maximum value in the smoothed data closest to a contact position that the touch sensor detects; and
a frequency determination unit configured to determine a setting frequency based on the peak frequency.

7. The frequency setting device according to claim 6, wherein the frequency determination unit rounds the peak frequency to a frequency having predetermined digits closest to the peak frequency so as to determine the setting frequency.

8. The frequency setting device according to claim 6, further comprising:
a signal intensity storage unit configured to store the signal intensity data indicating the signal intensity for a predetermined period of time for each of the multiple frequencies; and
an averaging unit configured to average the signal intensity data for a predetermined period of time for each of the multiple frequencies to produce average data,
wherein the smoothing unit produces the smoothed data by smoothing the average data.

9. A frequency setting method comprising:
measuring, at predetermined time intervals, signal intensity that an input signal of each of multiple frequencies in a predetermined frequency band has;

displaying the signal intensity of each of the multiple frequencies on a display of a spectrum analyzer;
smoothing signal intensity data indicating the signal intensity of each of the multiple frequencies to produce smoothed data;
detecting a contact position by a touch sensor placed on the display;
detecting, as a peak frequency, a frequency at a position indicating a maximum value in the smoothed data closest to the contact position; and
determining a setting frequency based on the peak frequency.

\* \* \* \* \*